United States Patent
Wang et al.

(10) Patent No.: US 11,562,884 B2
(45) Date of Patent: Jan. 24, 2023

(54) CURRENT SOURCE APPARATUS AND METHOD

(71) Applicant: ASML Netherlands B.V., Veldhoven (NL)

(72) Inventors: Yixiang Wang, Fremont, CA (US); Yanqiu Wang, Fremont, CA (US); Xiaodong He, Beijing (CN); Guofan Ye, South San Francisco, CA (US)

(73) Assignee: ASML Netherlands B.V., Veldhoven (NL)

( * ) Notice: Subject to any disclaimer, the term of this patent is extended or adjusted under 35 U.S.C. 154(b) by 284 days.

(21) Appl. No.: 16/852,325

(22) Filed: Apr. 17, 2020

(65) Prior Publication Data
US 2020/0335298 A1    Oct. 22, 2020

Related U.S. Application Data

(60) Provisional application No. 62/836,282, filed on Apr. 19, 2019.

(51) Int. Cl.
*H01J 37/24*  (2006.01)
*H01J 37/141*  (2006.01)

(52) U.S. Cl.
CPC .......... *H01J 37/241* (2013.01); *H01J 37/141* (2013.01); *H01J 2237/141* (2013.01)

(58) Field of Classification Search
CPC ........ H01J 37/14; H01J 37/141; H01J 37/145; H01J 37/24; H01J 37/241
See application file for complete search history.

(56) References Cited

U.S. PATENT DOCUMENTS

| | | | |
|---|---|---|---|
| 7,619,218 B2 | 11/2009 | Nakano et al. | |
| 9,918,367 B1* | 3/2018 | Scenini | H05B 47/00 |
| 2013/0082611 A1 | 4/2013 | Cohen | |
| 2013/0278267 A1 | 10/2013 | Hori et al. | |
| 2014/0166893 A1 | 6/2014 | Yamada | |
| 2015/0061621 A1 | 3/2015 | Pons | |
| 2017/0236683 A1* | 8/2017 | Hegele | H01J 37/265 |
| | | | 250/307 |
| 2017/0371366 A1 | 12/2017 | Liu | |

(Continued)

FOREIGN PATENT DOCUMENTS

| | | | |
|---|---|---|---|
| CN | 108076560 A | 5/2018 | |
| EP | 2522992 A2 | 11/2012 | |

(Continued)

OTHER PUBLICATIONS

Office Action issued by the Intellectual Property Office (IPO) in related ROC (Taiwan) Patent Application No. 109113020; dated Mar. 8, 2021 (13 pgs.).

(Continued)

*Primary Examiner* — David E Smith
(74) *Attorney, Agent, or Firm* — Finnegan, Henderson, Farabow, Garrett & Dunner, LLP

(57) ABSTRACT

Disclosed among other aspects is a power supply such as may be used in a charged particle inspection system. The power supply includes a direct current source such as a programmable linear current source connected to a controlled voltage source where the control signal for the controlled voltage source is derived from a measured voltage drop across the direct current source.

15 Claims, 3 Drawing Sheets

(56) References Cited

U.S. PATENT DOCUMENTS

2018/0033588 A1 2/2018 Kumamoto et al.
2018/0211815 A1 7/2018 Fichter et al.

FOREIGN PATENT DOCUMENTS

| JP | S51 145850 U | 11/1976 | |
|---|---|---|---|
| TW | 2009-45156 A | 11/2009 | |
| WO | WO-9954798 A1 * | 10/1999 | ............ G05F 1/569 |
| WO | WO 2015/104407 A1 | 7/2015 | |
| WO | WO-2015104407 A1 * | 7/2015 | ............ H05B 31/50 |

OTHER PUBLICATIONS

International Search Report issued by the International Searching Authority in related PCT International Application No. PCT/EP2020/059558, dated Jul. 2, 2020 (4 pgs.).
Envelope Tracking—Wikipedia, Jun. 22, 2017 (Jun. 22, 2017), XP055708200, Retrieved from the Internet: URL:https://en.wikipedia.org/w/index.php?title=Envelopetracking&oldid=786914015 [retrieved on Jun. 23, 2020].

* cited by examiner

CURRENT SOURCE APPARATUS AND METHOD

CROSS-REFERENCE TO RELATED APPLICATIONS

This application claims priority of U.S. application 62/836,282 which was filed on Apr. 19, 2019, and which is incorporated herein in its entirety by reference.

TECHNICAL FIELD

The embodiments provided herein relate to a current source, such as a current source that may be used to supply current to a load such as a lens in a charged particle operator with one or more charged particle beams (e.g., an electron microscopy apparatus utilizing one or more electron beams).

BACKGROUND

Integrated circuits are made by creating patterns on a wafer, also called a substrate. The wafer is supported on a wafer stage in the equipment for creating the pattern. One part of the process for making the integrated circuits involves looking at or "inspecting" parts of the wafer. This may be done with a charged particle operator such as a scanning electron microscope or SEM.

Optical microscopes use visible light and a transparent lense(s) or mirror(s) to render objects as small as about one micrometer visible. The resolving power of an optical microscope is limited by the wavelength of the light used for illumination. Charged particle operators use a beam of charged particles instead of light, and use electromagnetic or electromagnetic/electric lenses to focus the particles. They can make features as small as one-tenth of a nanometer visible.

Charged particle operators include a column having elements analogous to those of a light microscope. The light source of the light microscope is replaced by a charged particle source, which is built into the column. Instead of glass lenses, a charged particle operator has electromagnetic or electromagnetic/electric lenses. The power (focal length) of these lenses can be changed by changing the current through the lens coil. There is a need for an improvement in the current drivers that provide the current to the lens coil.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to an aspect of an embodiment, there is disclosed a power unit comprising a controlled voltage source arranged to receive a voltage control input signal and adapted to provide a controlled voltage at a controlled voltage output based at least in part on the voltage control input signal and a direct current source such as a programmable linear current source with a current source input and a current source output, the current source input being arranged to receive the controlled voltage output. The current source output may be arranged to supply current to the load which may be a lens in a charged particle operator. The power unit may also include a circuit arranged to sense a magnitude of a voltage drop across the direct current source and adapted to generate the voltage control input signal based at least in part on the magnitude of the voltage drop. The controlled voltage source may be controlled such that a voltage drop across the direct current source remains within a programmable, presettable, or predetermined range.

In accordance with another aspect of an embodiment, there is disclosed a lens in a charged particle operator system comprising a controlled voltage source arranged to receive a voltage control input signal and adapted to provide a controlled voltage at a controlled voltage output based at least in part on the voltage control input signal, a direct current source such as a programmable linear current source arranged to receive the controlled voltage output and adapted to supply a controlled current, a load in a charged particle operator such as a lens coil arranged to receive the controlled current, and a circuit arranged to sense a magnitude of a voltage drop across the direct current source such as a programmable linear current source rand adapted to generate the voltage control input signal based at least in part on the magnitude of the voltage drop. The controlled voltage source may be controlled such that a voltage drop across the direct current source such as a programmable linear current source remains within a programmable, presettable, or predetermined range.

In accordance with another aspect of an embodiment, there is disclosed a method of supplying power to a load in a charged particle operator such as a lens coil, the method comprising the steps of generating a controlled voltage based at least in part on a voltage control input signal, supplying the controlled voltage to a direct current source such as a programmable linear current source, using the direct current source to generate a drive current, and supplying the drive current to the load in a charged particle operator. The method may further comprise sensing a voltage drop across the direct current source such as a programmable linear current source, and generating the voltage control input signal based at least in part on the voltage drop. The step of generating the voltage control input signal based at least in part on the voltage drop across the direct current source such as a programmable linear current source may be carried out such that a voltage drop across the direct current source such as a programmable linear current source remains within a programmable, presettable, or predetermined range.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF FIGURES

The accompanying drawings, which are incorporated herein and form part of the specification, illustrate the present invention and, together with the description, further serve to explain the principles of the present invention and to enable a person skilled in the relevant art(s) to make and use the present invention.

DETAILED DESCRIPTION

Figure 1:
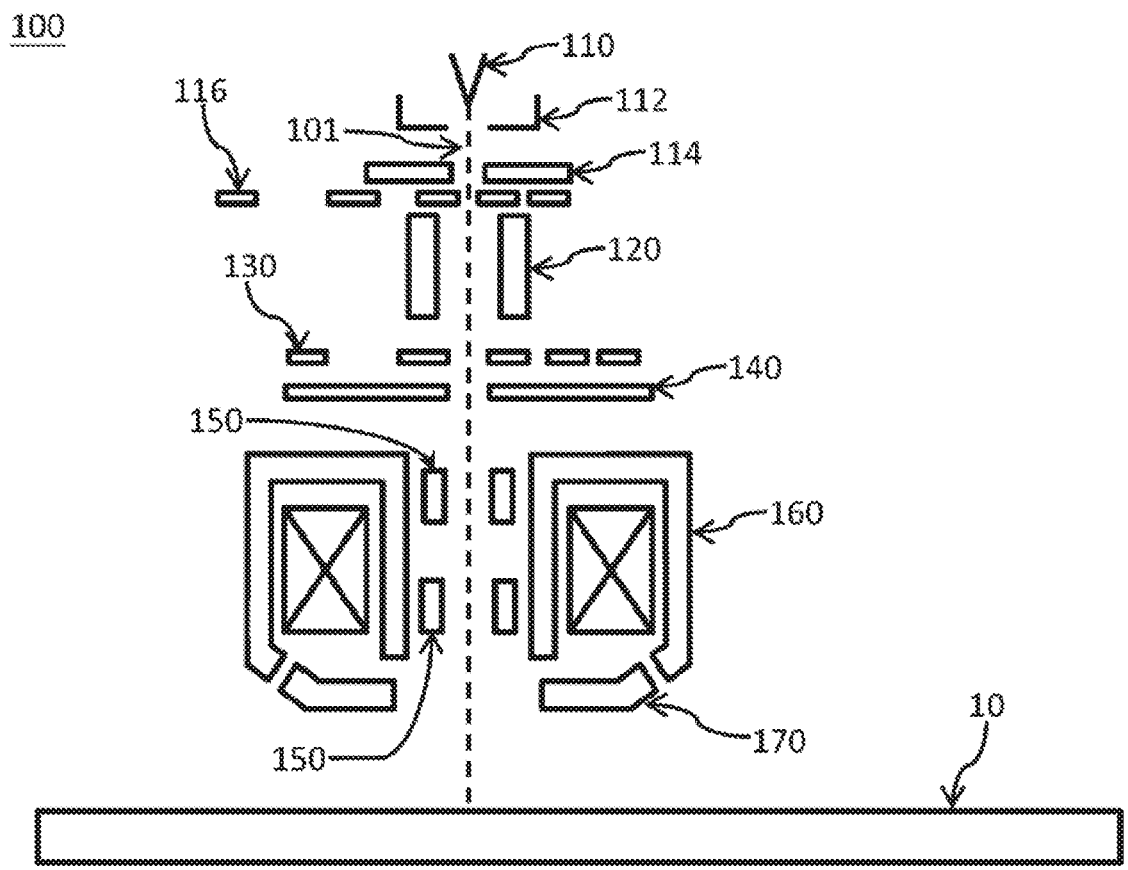
FIG. 1 is a diagram illustrating an exemplary charged particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems, apparatus, and methods consistent with aspects related to the invention as recited in the appended claims Relative dimensions of components in drawings may be exaggerated for clarity.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a charged particle operator. A charged particle operator can be used to image these extremely small structures, in effect, taking a "picture" of the structures. The image can be used to determine if the structure was formed properly and also if it was formed in the proper location. If the structure is defective then the process can be adjusted so the defect is less likely to recur.

As the name implies, charged particle operators use beams of charged particles because such beams can be used to see structures that are too small to be seen by optical microscopes, that is, microscopes using light. Charged particle operators include a column that includes elements that help shape and focus the beam of charged particles. These elements are referred to as lenses because they perform functions that are analogous to those performed by the lenses in a light microscope. Such a lens and other load in the charged particle operator that require current from a current source are referred to as a load in a charged particle operator herein. But instead of manipulating light, these lenses use magnetic fields or electric fields or a combination of magnetic and electric fields to manipulate the charged particle beam. The power of these lenses is controlled by controlling the amount of current supplied to the lenses by a lens current driver.

Typically the lens current driver uses a fixed voltage power source to provide power to the direct current source to enable the direct current source to provide current to drive the lens. With such a configuration the lens current driver is set up to maintain a current flowing through the lens coils. One disadvantage of such a configuration is that the sum of the voltage measured between one end of the coil and the other, plus the voltage drop across the current source, remains at the same value, resulting in a relatively higher amount of power being consumed, even when the current source provides only a small amount of current to the lens.

There is thus a need to reduce power consumption and avoid the need to dissipate excess heat resulting from excessive power consumption. In accordance with one aspect of an embodiment, these needs are addressed by providing an arrangement having reduced power consumption. This saves operational cost. Also, when the load receives less current, less heat is dissipated, which leads to greater stability and less expansion of components, which leads to improved accuracy (e.g., the wafer expands less, the stage expands less, and so forth) resulting is less movement and a corresponding smaller error due to positional change.

The arrangement reduces power consumption by placing a controlled voltage source in series with a direct current source such as a programmable linear current source. In such an arrangement, when the load requires less current, so that the voltage drop across the load will be smaller, it is not left to the current source to take up the remainder of a fixed overall voltage drop. Instead, the overall voltage is reduced, leaving less for the current source to take up, meaning the current source does not need use as much power and generates less heat.

Newer designs require more powerful magnetic lenses due to the need to focus, collimate, and in general manipulate beams with higher landing energies. This means that the lens coils in general have more turns and so exhibit a higher resistance. Driving these lenses requires a new design for a much higher voltage power supply and higher current. Also, as the resistance increases the heat that is generated by the voltage source increases. Handling this heat imposes a significant design challenge. For example, excessive heat loads can have a negative effect on the current output stability. Of course, this is an approximate description, and the actual details are set forth more completely and precisely below.

Without limiting the scope of the present disclosure, descriptions and drawings of embodiments may be exemplarily referred to as using a charged particle beam. However, the embodiments are not used to limit the present invention to specific charged particles such as electrons. For example, systems and methods for beam forming may be applied to photons, x-rays, and ions, etc. Furthermore, the term "beam" may refer to primary charged particle beams, primary charged particle beamlets, secondary charged particle beams, or secondary charged particle beamlets, among others.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

In the description and in the claims the terms "up," "down," "top," "bottom," "vertical," "horizontal," and like terms may be employed. These terms are intended to show relative orientation only and not any absolute orientation such as orientation with respect to gravity unless otherwise intended as indicated. Similarly, terms such as left, right, front, back, etc., are intended to give only relative orientation.

With reference to FIG. 1, a charged particle beam operator 100, based on an SEM in an embodiment, is provided for defect inspection. The charged particle beam operator 100 in sequence includes a charged particle tip 110 for emitting a primary charged particle beam 101, an anode 112 for extracting charged particles from the tip 110, an electrode 114 with one aperture for selecting suitable solid angle charged particles in the primary beam 101, a plate 116 such as a Coulomb plate with several apertures for trimming the primary charged particle beam 101 to reduce field effects, a condenser lens 120 for condensing the primary charged particle beam 101, and a plate 130 with several apertures for further trimming the primary beam 10 to control beam current of the primary charged particle beam 101. In the discussion which follows, the embodiments will be described primarily using a specific type of charged particle operator, a SEM, and a specific type of charged particle, an electron, but it will be understood that the teachings provided herein apply equally to other systems using other types of charged particles.

The tool shown in FIG. 1 also includes a detector 140 for receiving SE (Secondary Electrons) and BSE (Backscatter Electrons) emanating from the specimen 10, a deflector unit 150 for scanning the primary electron beam 101, a magnetic objective lens 160 for focusing the primary electron beam 101 onto the specimen 10, and an electrode 170 for providing retard force to the primary electron beam 101 such that landing energy of the primary electron beam 101 can be lowered. Pole piece of the objective lens 160, the electrode 170, and the specimen 10 supported by a stage can constitute an electric lens which combined with the magnetic lens to form an EM (electromagnetic) compound objective lens.

An existing lens driver for any of the lenses in such a system is typically implemented as a fixed voltage power supply and a direct current source. The voltage drop $V_{CS}$ across the current source and the voltage drop $V_L$ across the load, for example, the lens coil, will always sum to the fixed voltage V produced by the voltage source. When the current of the direct current source is at a lower end of its operational range then the drop $V_L$ across the load will be relatively lower. Thus more of the voltage drop must occur across the current source, that is, $V_{CS}$ will be higher. This requires that the current source dissipate more power with the attendant issues of heat dissipation and current stability.

Figure 2:
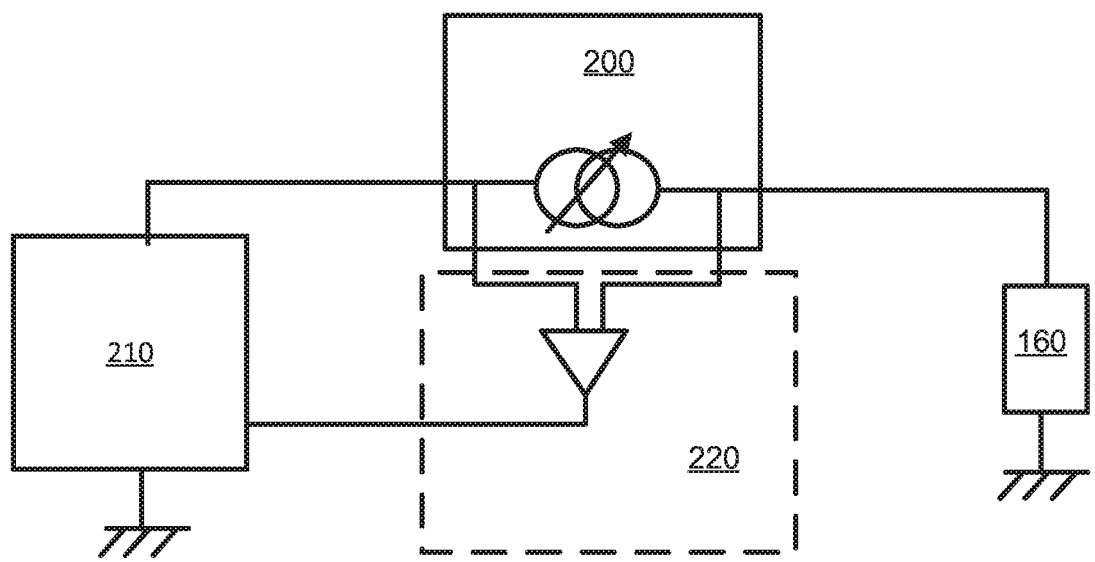
FIG. 2 is a schematic diagram illustrating a power control circuit in accordance with an aspect of an embodiment.

A circuit for supplying a current to the lens in accordance with one aspect of an embodiment is shown in FIG. 2. A current I is supplied to the lens coils 160 by a direct current source 200 such as a programmable linear current source. A controlled voltage source 210 supplies a voltage to the direct current source 200. A closed loop feedback circuit 220 supplies a control signal to the controlled voltage source 210 based on the magnitude of a voltage drop across the direct current source 200.

Figure 3:
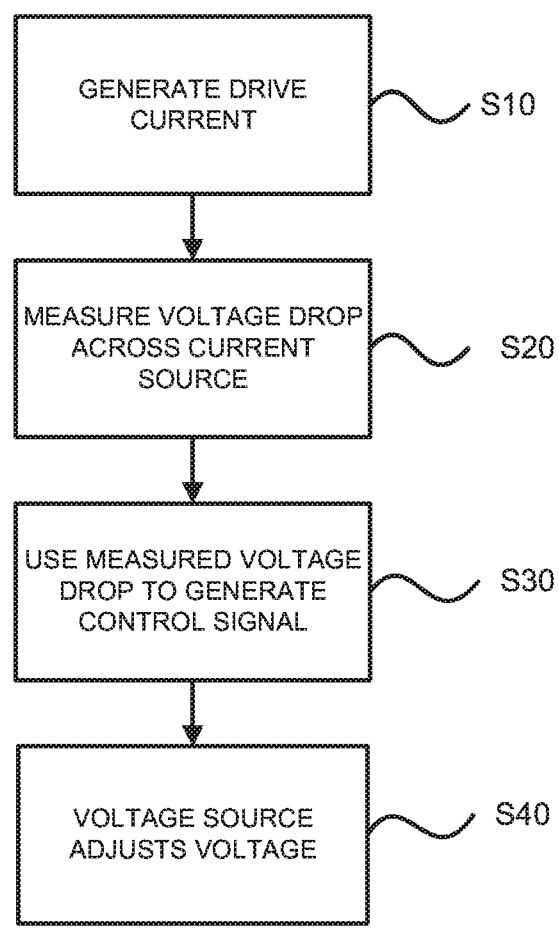
FIG. 3 is a flowchart showing exemplary steps in a method of supplying current to a load such as a lens according to an aspect of an embodiment.

In an arrangement such as that shown in FIG. 2 the voltage produced by the controlled voltage source is no longer fixed. The overall voltage drop remains the sum of the voltage drop across the current source and the load. When the current I is at a lower end of its operational range, however, then the voltage drop across the current source is sensed and the controlled voltage of the controlled voltage source is reduced to in turn reduce the voltage drop across the current source. This results in a reduction in the amount of power consumed by the combination of the voltage and current sources In particular the voltage source can be controlled so the voltage drop across the current source remains within a programmable or presettable or predetermined range. In general, the voltage $V_{210}$ from the voltage source 210 will be the sum of the voltage drop $V_{200}$ over the current source and the voltage drop $V_{160}$ over the lens coil 160. It is preferred that $V_{200}$ be less than or equal to $V_{160}$, that is, that $V_{200}$ is minimized According to another aspect of an embodiment, there is disclosed a method of supplying a current to a current load such as a lens coil in a charged particle operator. With reference to FIG. 3 in a first step S10 a drive current is generated using a direct current source such as a programmable linear current source. Then, in a step S20, a voltage drop across the direct current source such as a programmable linear current source is sensed. In a step S30, the sensed voltage drop across the current source is used to generate a control signal input to control the voltage source generating the voltage for the current source. In a step S40 the voltage source adjusts its voltage in accordance with the control signal input. For example, when the sensed voltage drop across the current source increases, the control input signal controls the voltage source to reduce the voltage of the voltage source, and when the sensed voltage drop across the current source decreases, the control input signal controls the voltage source to increase the voltage of the voltage source. It will be understood that some combination of these steps including all of them may occur essentially concurrently.

The embodiments may further be described using the following clauses:

1. A power unit comprising:
    a controlled voltage source arranged to receive a voltage control input signal and adapted to provide a controlled voltage at a controlled voltage output based at least in part on the voltage control input signal; and
    a direct current source with a current source input and a current source output, the current source input being arranged to receive the controlled voltage output.

2. The power unit of clause 1 wherein the direct current source comprises a programmable linear current source 3. The power unit of clause 1 or 2 wherein the direct current source is arranged to supply current to a load in a charged particle operator.

4. The power unit of clause 3 wherein the load in a charged particle operator comprises a lens coil.

5. The power unit of any one of clauses 1-4 further comprising a circuit arranged to sense a magnitude of a voltage drop across the direct current source and adapted to generate the voltage control input signal based at least in part on the magnitude of the voltage drop.

6. The power unit of clause 1 wherein
    the direct current source comprises a programmable linear current source output and is arranged to supply current to a load in a charged particle operator and
    the voltage control input signal has a value indicative a magnitude of a voltage drop across the programmable linear current source, and wherein the controlled voltage source is controlled such that a voltage drop across the programmable linear current source remains within an operational range.

7. The power unit of clause 6 wherein the operational range is a programmable range.

8. The power unit of clause 6 wherein the operational range is a presettable range.

9. The power unit of clause 6 wherein the operational range is a predetermined range.

10. The power unit of clause 6 wherein the load in a charged particle operator comprises a lens coil.

11. A current source load system comprising:
a controlled voltage source arranged to receive a voltage control input signal and adapted to provide a controlled voltage at a controlled voltage output based at least in part on the voltage control input signal;
a direct current source arranged to receive the controlled voltage output and adapted to supply a current;
a current source load arranged to receive the current; and
a circuit arranged to sense a magnitude of a voltage drop across the direct current source and adapted to generate the voltage control input signal based at least in part on the magnitude of the voltage drop.

12. The current source load system of clause 11 wherein the direct current source comprises a programmable linear current source 13. The current source load system of clause 11 or 12 wherein the controlled voltage source is controlled such that a voltage drop across the direct current source such as a programmable linear current source remains within an operational range.

14. The current source load system of clause 13 wherein the operational range is a programmable range.

15. The current source load system of clause 13 wherein the operational range is a presettable range.

16. The current source load system of clause 13 wherein the operational range is a predetermined range.

17. The current source load system of any one of clauses 11-16 wherein the current source load comprises a lens in a charged particle operator system.

18. A method of supplying power to a current source load, the method comprising the steps of:
generating a controlled voltage based at least in part on a voltage control input signal;
supplying the controlled voltage to a direct current source;
using the direct current source to generate a drive current; and
supplying the drive current to the current source load.

19. The method of clause 18 further comprising the steps of:
sensing a voltage drop across the direct current source; and
generating the voltage control input signal based at least in part on the voltage drop.

20. The method of clause 18 wherein the direct current source comprises a programmable linear current source.

21. The method of clause 20 further comprising the steps of:
sensing a voltage drop across the programmable linear current source; and
generating the voltage control input signal based at least in part on the voltage drop.

22. The method of any one of clauses 18-21 wherein the step of generating the voltage control input signal based at least in part on the voltage drop across the direct current source such as a programmable linear current source is carried out such that a voltage drop across the direct current source such as a programmable linear current source remains within an operational range.

23. The method of any one of clauses 18-21 wherein the operational range is a programmable range.

24. The method of any one of clauses 18-21 wherein the operational range is a presettable range.

25. The method of any one of clauses 18-21 wherein the operational range is a predetermined range.

While the foregoing description is in terms of a current supply for a lens in a charged particle imaging system, it will be appreciated that the current supply may be beneficially employed to supply current in other applications.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The invention claimed is:

1. A power unit comprising:
a controlled voltage source arranged to receive a voltage control input signal and adapted to provide a controlled voltage at a controlled voltage output based at least in part on the voltage control input signal; and
a direct current source with a current source input and a current source output, the current source input being arranged to receive the controlled voltage output;
wherein the direct current source comprises a programmable linear current source.

2. A power unit as claimed in claim 1 wherein the direct current source is arranged to supply current to a load in a charged particle operator.

3. A power unit as claimed in claim 2 wherein the load in a charged particle operator comprises a lens coil.

4. A power unit as claimed in claim 1 further comprising a circuit arranged to sense a magnitude of a voltage drop across the direct current source and adapted to generate the voltage control input signal based at least in part on the magnitude of the voltage drop.

5. A power unit as claimed in claim 1 wherein
the direct current source is arranged to supply current to a load in a charged particle operator and
the voltage control input signal has a value indicative a magnitude of a voltage drop across the programmable linear current source, and wherein
the controlled voltage source is controlled such that a voltage drop across the programmable linear current source remains within an operational range.

6. A power unit as claimed in claim 5 wherein the operational range is a programmable range.

7. A power unit as claimed in claim 5 wherein the operational range is a presettable range.

8. A power unit as claimed in claim 5 wherein the operational range is a predetermined range.

9. A power unit as claimed in claim 5 wherein the load in a charged particle operator comprises a lens coil.

10. A method of supplying power to a current source load, the method comprising the steps of:

generating a controlled voltage based at least in part on a voltage control input signal;

supplying the controlled voltage to a direct current source;

using the direct current source to generate a drive current; and supplying the drive current to the current source load;

wherein the direct current source comprises a programmable linear current source.

11. A method as claimed in claim 10 further comprising the steps of:

sensing a voltage drop across the direct current source; and generating the voltage control input signal based at least in part on the voltage drop.

12. A method as claimed in claim 10 further comprising the steps of:

sensing a voltage drop across the programmable linear current source; and generating the voltage control input signal based at least in part on the voltage drop.

13. A method as claimed in claim 10 wherein the step of generating the voltage control input signal based at least in part on the voltage drop across the direct current source is carried out such that a voltage drop across the direct current source remains within an operational range.

14. A power unit comprising:

a controlled voltage source arranged to receive a voltage control input signal and adapted to provide a controlled voltage at a controlled voltage output based at least in part on the voltage control input signal; and a direct current source with a current source input and a current source output, the current source input being arranged to receive the controlled voltage output;

wherein the direct current source is arranged to supply current to a load in a charged particle operator.

15. A method of supplying power to a current source load, the method comprising the steps of:

generating a controlled voltage based at least in part on a voltage control input signal;

supplying the controlled voltage to a direct current source;

using the direct current source to generate a drive current; and supplying the drive current to the current source load;

wherein the current source load is in a charged particle operator.

\* \* \* \* \*